United States Patent
Lee et al.

(10) Patent No.: US 10,663,528 B2
(45) Date of Patent: May 26, 2020

(54) METHOD OF MEASURING DISTRIBUTION OF BINDER IN ELECTRODE

(71) Applicant: LG Chem, Ltd., Seoul (KR)

(72) Inventors: Taek Soo Lee, Daejeon (KR); Jung Woo Yoo, Daejeon (KR); Je Young Kim, Daejeon (KR)

(73) Assignee: LG Chem, Ltd. (KR)

( * ) Notice: Subject to any disclaimer, the term of this patent is extended or adjusted under 35 U.S.C. 154(b) by 363 days.

(21) Appl. No.: 15/744,524

(22) PCT Filed: Oct. 7, 2016

(86) PCT No.: PCT/KR2016/011275
§ 371 (c)(1),
(2) Date: Jan. 12, 2018

(87) PCT Pub. No.: WO2017/061830
PCT Pub. Date: Apr. 13, 2017

(65) Prior Publication Data
US 2018/0210034 A1    Jul. 26, 2018

(30) Foreign Application Priority Data
Oct. 8, 2015   (KR) .................. 10-2015-0141821

(51) Int. Cl.
*G01R 31/36* (2020.01)
*G01R 31/385* (2019.01)
(Continued)

(52) U.S. Cl.
CPC .......... *G01R 31/3865* (2019.01); *H01M 4/04* (2013.01); *H01M 4/139* (2013.01); *H01M 4/364* (2013.01);
(Continued)

(58) Field of Classification Search
CPC .. G01R 31/3865; H01M 4/139; H01M 4/621; H01M 10/4285; H01M 4/04;
(Continued)

(56) References Cited

U.S. PATENT DOCUMENTS

| 2006/0257739 A1 | 11/2006 | Ryu et al. |
| 2010/0273052 A1 | 10/2010 | Sakitani et al. |

(Continued)

FOREIGN PATENT DOCUMENTS

| CN | 1704765 A | 12/2005 |
| CN | 102356491 A | 2/2012 |

(Continued)

OTHER PUBLICATIONS

Search report from International Application No. PCT/KR2016/011275, dated Jan. 18, 2017.

(Continued)

*Primary Examiner* — Son T Le
*Assistant Examiner* — Adam S Clarke
(74) *Attorney, Agent, or Firm* — Lerner, David, Littenberg, Krumholz & Mentlik, LLP

(57) ABSTRACT

A method of the present invention includes measuring a thickness of an electrode in which an active material layer is formed on a current collector (Step 1); fixing the active material layer of the electrode to a substrate (Step 2); attaching a removal tape to the current collector of the electrode, and then measuring an adhesive strength of the removal tape and measuring a thickness of the electrode after the removal (Step 3); attaching a removal tape to the active material layer from which the current collector is removed, and then measuring an adhesive strength of the removal tape and measuring the thickness of the electrode after the removal, wherein this procedure is repeated until a measurement limit is reached (Step 4); and determining a (Continued)

distribution of a binder according to the thickness of the electrode from measured values obtained in Steps 3 and 4 (Step 5).

14 Claims, 1 Drawing Sheet

(51) Int. Cl.
   *H01M 4/139*     (2010.01)
   *H01M 4/62*      (2006.01)
   *H01M 10/42*     (2006.01)
   *H01M 4/04*      (2006.01)
   *H01M 10/48*     (2006.01)
   *H01M 4/36*      (2006.01)
   *H01M 4/505*     (2010.01)
   *H01M 4/525*     (2010.01)
   *H01M 10/058*    (2010.01)
   *H01M 10/0525*   (2010.01)

(52) U.S. Cl.
   CPC ........... *H01M 4/505* (2013.01); *H01M 4/525* (2013.01); *H01M 4/621* (2013.01); *H01M 4/623* (2013.01); *H01M 4/625* (2013.01); *H01M 10/4285* (2013.01); *H01M 10/48* (2013.01); *H01M 10/058* (2013.01); *H01M 10/0525* (2013.01)

(58) Field of Classification Search
   CPC ...... H01M 10/48; H01M 4/364; H01M 4/505; H01M 4/525; H01M 4/623; H01M 4/625; H01M 10/058; H01M 10/0525
   See application file for complete search history.

(56) References Cited

U.S. PATENT DOCUMENTS

| | | | |
|---|---|---|---|
| 2010/0323242 A1 | 12/2010 | Choi et al. | |
| 2014/0205904 A1 | 7/2014 | Sasaki | |
| 2014/0287308 A1* | 9/2014 | Okada | H01M 4/0404 |
| | | | 429/217 |
| 2015/0333308 A1* | 11/2015 | Toyoda | H01M 2/145 |
| | | | 429/144 |
| 2017/0338459 A1* | 11/2017 | Nakahiro | H01M 10/058 |

FOREIGN PATENT DOCUMENTS

| | | |
|---|---|---|
| JP | 2006172976 A | 6/2006 |
| JP | 2013062139 A | 4/2013 |
| JP | 2014013697 A | 1/2014 |
| JP | 2014165156 A | 9/2014 |
| JP | 2015068664 A | 4/2015 |
| JP | 2015141822 A | 8/2015 |
| KR | 20060107341 A | 10/2006 |
| KR | 20100112127 A | 10/2010 |
| KR | 20140063632 A | 5/2014 |

OTHER PUBLICATIONS

Chinese Search Report for Application No. 201680045560.6, dated Dec. 18, 2019, pp. 1-2.

* cited by examiner

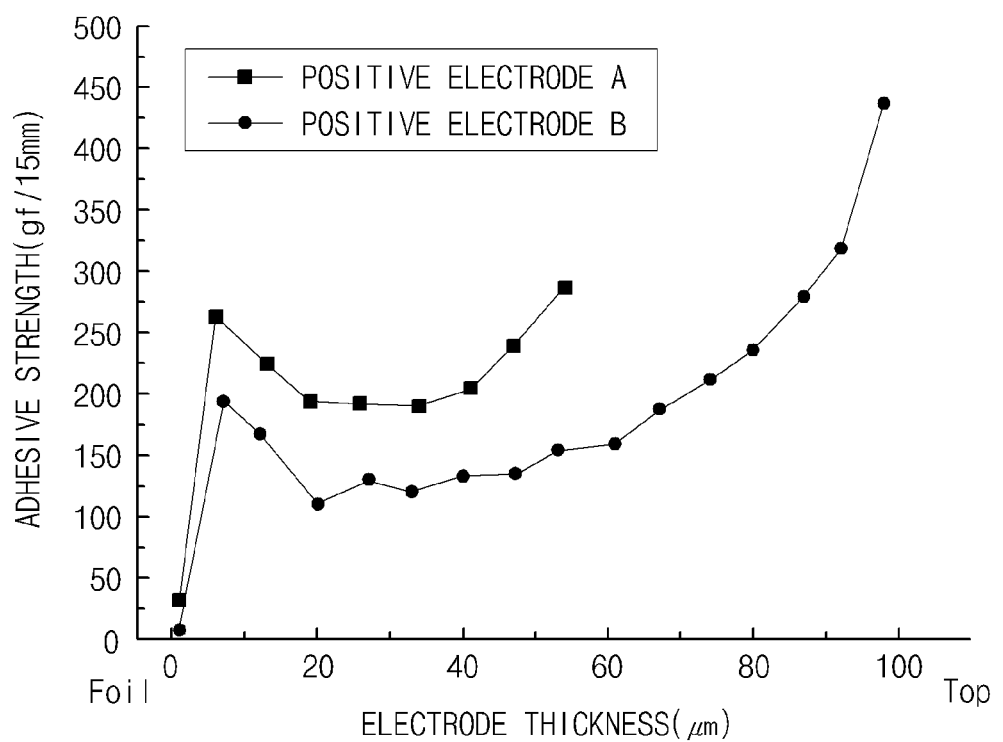

METHOD OF MEASURING DISTRIBUTION OF BINDER IN ELECTRODE

CROSS-REFERENCE TO RELATED APPLICATION

The present application is a national phase entry under 35 U.S.C. § 371 of International Application No. PCT/KR2016/011275, filed on Oct. 7, 2016, which claims priority from Korean Patent Application No. 10-2015-0141821, filed Oct. 8, 2015, the disclosures of which are incorporated herein by reference.

TECHNICAL FIELD

The present invention relates to a method of measuring a distribution of a binder in an electrode.

BACKGROUND ART

With the dramatic increase in the use of fossil fuels, there is an increasing demand for use of alternative energy or clean energy. The field of electricity generation and accumulation using an electrochemical reaction has been most actively studied to meet the increasing demand.

A current representative example of an electrochemical device using such electrochemical energy may include secondary batteries, and their applications have been on the gradual rise. Recently, the demand for secondary batteries as energy sources has surged with the increase in technical development and the demand for portable devices such as laptop computers, portable telephones, cameras, etc. Among such secondary batteries, a lithium secondary battery having high energy density and working potential, a long cycle lifespan, and a low self-discharge rate has been actively researched and widely used through commercialization.

Generally, a secondary battery consists of a positive electrode, a negative electrode, and an electrolyte, and is chargeable and dischargeable because it serves to transfer energy to electrodes while moving back and forth between both of the electrodes by intercalating lithium ions such as carbon particles emitted from a positive electrode active material into a negative electrode active material during a first charge and then deintercalating the lithium ions from the negative electrode active material during the discharge.

For example, the lithium secondary battery has a structure in which a lithium electrolyte is impregnated into an electrode assembly, which includes a positive electrode including a lithium transition metal oxide as an electrode active material, a negative electrode including a carbon-based active material, and a porous separator. The positive electrode is manufactured by coating an aluminum foil with a positive electrode mixture including a lithium transition metal oxide, and the negative electrode is manufactured by coating a copper foil with a negative electrode mixture including a carbon-based active material.

To check for uniformity in physical properties of a secondary battery, a technology capable of accurately measuring a distribution of a binder in a positive electrode mixture or a negative electrode mixture is required.

PRIOR-ART DOCUMENT

Patent Document 1: Korean Unexamined Patent Publication No. 10-2014-0063632

DISCLOSURE

Technical Problem

Therefore, the present invention is designed to solve the problems of the prior art, and it is an object of the present invention to provide a method of measuring a distribution of a binder according to a thickness of an electrode, which includes measuring an adhesive strength according to a thickness of an electrode spanning from a current collector to an end of an active material layer.

It is another object of the present invention to provide a method of manufacturing a secondary battery, which has a uniform distribution of a binder according to a thickness of an electrode, by using the method of measuring a distribution of a binder, a secondary battery manufactured by the method of manufacturing, a battery module, and a battery pack.

Technical Solution

To solve the above problems, according to an aspect of the present invention, there is provided a method of measuring a distribution of a binder in an electrode, which includes measuring a thickness of an electrode in which an active material layer, which includes an active material, a conductive material, and a binder, is formed on a current collector (Step 1); fixing the active material layer of the electrode to a substrate so that the active material layer comes into contact with the substrate (Step 2); attaching a removal tape to the current collector of the electrode, and then measuring an adhesive strength of the removal tape while removing the removal tape and the current collector and measuring a thickness of the electrode after the removal (Step 3); attaching a removal tape to the active material layer from which the current collector is removed, and then measuring an adhesive strength of the removal tape while removing portions of the removal tape and the active material layer and measuring the thickness of the electrode after the removal, wherein this procedure is repeated until a measurement limit is reached (Step 4); and determining a distribution of the binder according to the thickness of the electrode from measured values obtained in Steps 3 and 4 (Step 5).

According to another aspect of the present invention, there is provided a method of manufacturing a secondary battery, which includes performing the method of measuring a distribution of a binder in an electrode as defined above on a plurality of electrodes manufactured under different conditions; and selecting an electrode having a uniform distribution of a binder according to thicknesses of the electrodes.

Advantageous Effects

The method of measuring a distribution of a binder in an electrode according to the present invention can be useful in more accurately measuring a distribution of a binder by using a method of measuring an adhesive strength according to a thickness of an electrode and repeating a procedure of attaching a removal tape to a current collector and an active material layer and removing the removal tape, wherein the procedure is repeated on the electrode spanning from the current collector to an end of the active material layer. In this case, the method can be useful in performing the measurement in a short time at a low cost.

DESCRIPTION OF DRAWINGS

FIG. 1 is a graph illustrating an adhesive strength of a removal tape according to an electrode thickness of each of positive electrodes A and B according to one exemplary embodiment of the present invention; the electrode thickness and the adhesive strength are used as the X and Y axes, respectively.

BEST MODE

Hereinafter, the present invention will be described in further detail to aid in understanding the present invention.

The terms and words used in this specification and the appended claims are not to be interpreted as limited to commonly used meanings or meanings in dictionaries and should be interpreted with meanings and concepts which are consistent with the technological scope of the disclosure based on the principle that the present inventors have appropriately defined concepts of terms to describe the present invention in the best way.

The terminology provided herein is merely used for the purpose of describing particular embodiments, and is not intended to be limiting of exemplary embodiments of the present invention. The singular forms "a," "an," and "the" are intended to include the plural forms as well, unless the context clearly indicates otherwise.

It should be understood that the terms "comprises," "comprising," "includes," "including," "has," and/or "having," when used herein, specify the presence of stated features, integers, steps, operations, elements, components, and/or combinations thereof, but do not preclude the presence or addition of one or more other features, integers, steps, operations, elements, components, and/or combinations thereof.

In a secondary battery, an electrode may be generally manufactured by coating a current collector with slurry obtained by mixing an active material, a conductive material, and a binder in a solvent. In this case, because the binder may move to an upper end of the active material layer during a process of evaporating the solvent, a distribution of the binder according to a thickness of the electrode may not be uniform. To check for uniformity in physical properties of the secondary battery, an analysis of the distribution of the binder according to the thickness of the electrode is required.

However, because materials, such as an active material, a conductive material, and the binder, in the electrode are mixed, it is difficult to measure the distribution of the binder according to a thickness of an electrode manufactured in the form of a thin film having a thickness of several tens of micrometers to several hundreds of micrometers.

As is known in the prior art, a method capable of determining a distribution of a binder according to a thickness of an electrode may include a method of measuring a scratching force applied to a thin film-type electrode sample when the thin film-type electrode sample is scratched with a knife-shaped tip in a thickness direction thereof.

However, the method has a drawback in that it is difficult to measure only an adhesive strength of the binder to determine the distribution of the binder because the adhesive strength of the binder may be affected by physical properties, such as a surface friction or a flexibility of a material, which are miscible with the active material or the conductive material as well as the binder.

Another method may include a method of measuring an intensity of a peak observed at an intrinsic spectrum of a polymer in a thickness direction, in the case of a polymer binder, using infrared rays (FT-IR) or laser beams (Raman).

However, the method has a drawback in that it is difficult to represent a value for a wide region because only a narrow region is irradiated with light due to the characteristics of spectrometry, and a deviation of a measured value is high even when a lot of materials are placed in a middle of the narrow region even when the peak intensity is measured in the narrow region. Further, because a content of the binder is measured, it is difficult to analyze the measured value as the adhesive strength according to the thickness of the electrode.

However, the method of measuring a distribution of a binder in an electrode according to the present invention is carried out using a method of measuring an adhesive strength according to a thickness of the electrode by attaching a removal tape to a current collector and an active material layer and removing the removal tape. When the method is used, it is possible to accurately measure only the binder in a mixture by measuring intrinsic physical properties (i.e., adhesive strength) of the binder which may not be measured using the active material and a conductive material. Also, the distribution of the binder according to the thickness may be determined. As a result, the method has an advantage in that the distribution of the binder according to the thickness may be measured more accurately and in a short time at a low cost.

The method of measuring a distribution of a binder in an electrode according to the present invention includes measuring a thickness of an electrode in which an active material layer, which includes an active material, a conductive material, and a binder, is formed on a current collector (Step 1); fixing the active material layer of the electrode in a substrate so that the active material layer comes into contact with the substrate (Step 2); attaching a removal tape to the current collector of the electrode, and then measuring an adhesive strength of the removal tape while removing the removal tape and the current collector and measuring the thickness of the electrode after the removal (Step 3); attaching a removal tape onto the active material layer from which the current collector is removed, and then measuring an adhesive strength of the removal tape while removing portions of the removal tape and the active material layer and measuring the thickness of the electrode after the removal, wherein this procedure is repeated until a measurement limit is reached (Step 4); and determining a distribution of the binder according to the thickness of the electrode from the measured values obtained in Steps 3 and 4 (Step 5).

Hereinafter, each step of the method of measuring a distribution of a binder in an electrode according to the present invention will be described in detail.

In the method of measuring a distribution of a binder in an electrode according to the present invention, Step 1 includes measuring a thickness of an electrode in which an active material layer, which includes an active material, a conductive material, and a binder, is formed on a current collector. In Step 1, an electrode in which a distribution of the binder is to be measured may be manufactured, and a thickness of the electrode may be measured to make it possible to measure an adhesive strength according to the thickness of the electrode in a subsequent process.

In this case, the electrode may be manufactured by coating a current collector of the electrode with electrode slurry prepared by mixing an electrode mixture, which includes the active material, the conductive material, and the binder, with an organic solvent, and drying and rolling the current collector coated with the electrode slurry. In particular, a positive electrode or negative electrode active material may be used as the active material. Specifically, the positive electrode active material is not particularly limited, but a lithium transition metal oxide may be used as the positive electrode active material. The lithium transition metal oxide may, for example, include a Li.Co-based composite oxide such as $LiCoO_2$ and the like, a Li.Ni.Co.Mn-based composite oxide such as $LiNi_xCo_yMn_zO_2$ and the like, a Li.Ni-based composite oxide such as $LiNiO_2$ and the like, and a Li.Mn-based composite oxide such as $LiMn_2O_4$ and the like, which may be used alone or in a combination of two or more types thereof. Typically, a carbon material from which lithium ions may be occluded and released, a lithium metal, silicon, or tin may be used as the negative electrode active material. Preferably, the carbon material may be used. In this case, both of a low crystalline carbon and a highly crystalline carbon may be used as the carbon material. Representative examples of the low crystalline carbon include a soft carbon and a hard carbon, and representative examples of the highly crystalline carbon include natural graphite, kish graphite, pyrolytic carbon, mesophase pitch-based carbon fibers, meso-carbon microbeads, mesophase pitches, and high-temperature sintered carbon such as petroleum or coal tar pitch-derived cokes.

The conductive material is not particularly limited as long as the conductive material exhibits conductivity without causing a chemical change in batteries of interest. For example, a graphite such as natural graphite or an artificial graphite; a carbon black such as carbon black, acetylene black, Ketjen black, channel black, furnace black, lamp black, thermal black, and the like; a conductive fiber such as a carbon fiber or a metal fiber; a conductive tube such as a carbon nanotube; a metal powder such as fluorinated carbon, aluminum, or a nickel powder; a conductive whisker such as zinc oxide, potassium titanate, and the like; a conductive metal oxide such as titanium oxide; a conductive material such as a polyphenylene derivative, and the like may be used as the conductive material.

Various kinds of binder polymers such as a polyvinylidene fluoride-hexafluoropropylene copolymer (PVDF-co-HFP), polyvinylidene fluoride, polyacrylonitrile, polymethyl methacrylate, polyvinyl alcohol, carboxymethyl cellulose (CMC), starch, hydroxypropyl cellulose, regenerated cellulose, polyvinyl pyrrolidone, tetrafluoroethylene, polyethylene, polypropylene, polyacrylic acid, an ethylene-propylene-diene monomer (EPDM), sulfonated EPDM, a styrene-butadiene rubber (SBR), a fluorinated rubber, polyacrylic acid, and various polymers or copolymers thereof in which hydrogen is substituted with Li, Na or Ca, may be used as the binder.

For example, $Li(Ni_{0.6}Mn_{0.2}Co_{0.2})O_2$, carbon black, and PVDF may be used as the active material, the conductive material, and the binder, respectively. In this case, the active material, the conductive material, and the binder may be included at a weight ratio of 94 to 96:1 to 3:2 to 4, but the types and contents of the active material, the conductive material, and the binder are not limited thereto. For example, any material may be used at any content to manufacture electrodes used to measure a distribution of the binder.

A method of measuring a thickness of the manufactured electrode may be carried out using a measuring machine (a Schopper type Thickness Gauge).

In the method of measuring a distribution of a binder in an electrode according to the present invention, Step 2 includes fixing the active material layer of the electrode in a substrate so that the active material layer comes into contact with the substrate. In Step 2, an upper end of the active material layer is attached to the substrate to perform a measurement of an adhesive strength of a layer spanning from the current collector to an upper end of the active material layer.

In this case, a glass substrate may be used as the substrate, and a method of fixing the upper end of the active material layer of the electrode in the substrate may be carried out by disposing a substrate adhesive tape between the substrate and the upper end of the active material layer, but the method of fixing the upper end of the active material layer of the electrode in the substrate is not limited thereto. In this case, the substrate adhesive tape may have an adhesive strength of 500 gf/15 mm to 1,500 gf/15 mm. However, the adhesive strength of the substrate adhesive tape is not limited thereto. For example, a tape having an adhesive strength higher than an adhesive strength between the active material layer and the current collector and an adhesive strength between the active material layers may be properly selected and used as the substrate adhesive tape.

In the method of measuring a distribution of a binder in an electrode according to the present invention, Step 3 includes attaching a removal tape to the current collector of the electrode, and then measuring an adhesive strength of the removal tape while removing the removal tape and the current collector and measuring the thickness of the electrode after the removal. Step 3 may be the first step of measuring the adhesive strength according to the thickness of the electrode by attaching the removal tape to the current collector of the electrode in which the upper end of the active material layer is fixed to a glass plate in Step 2, and then measuring the adhesive strength of the removal tape while removing the removal tape and the current collector and measuring the thickness of the electrode after the removal.

In this case, the removal tape may have an adhesive strength of 500 gf/15 mm to 1,500 gf/15 mm, but the adhesive strength of the removal tape is not limited thereto. For example, a tape having an adhesive strength higher than the adhesive strength between the active material layer and the current collector and the adhesive strength between the active material layers may be properly selected and used. The adhesive strength of the removal tape may be the same or different from the adhesive strength of the substrate adhesive tape used in Step 2.

The removal of the removal tape and the current collector in Step 3 may be carried out by performing a peeling test. For example, the peeling test may be performed by allowing the removal tape to move to a distance of 50 mm from an original position thereof at a rate of 300 mm/min in a direction in which the current collector is bent at an angle of 180° toward a surface of the removal tape having no adhesive strength. However, the rate of the peeling test and the distance and angle of the removed removal tape are not limited thereto.

The current collector of the electrode may be removed through Step 3. In this case, a portion of the active material layer may also be removed together with the current collector.

In the method of measuring a distribution of a binder in an electrode according to the present invention, Step 4 includes attaching a removal tape onto the active material layer from which the current collector is removed, and then measuring an adhesive strength of the removal tape while removing portions of the removal tape and the active material layer and measuring the thickness of the electrode after the removal, wherein this procedure is repeated until a measurement limit is reached. In Step 4, a procedure of attaching the removal tape to the remaining active material layer and removing the removal tape is repeatedly performed after Step 3 to measure the adhesive strength of the removal tape during the removal and the thickness of the electrode after the removal. The removal of the portions of the removal tape and the active material layer in Step 4 may be performed by performing a peeling test in the same manner as in Step 3.

However, unlike the removal of the current collector in Step 3, a process of removing a portion of the active material layer after an area of the removal tape is decreased may be carried out. These measured values may be converted into the area and adhesive strength of the removal tape used in Step 3, and may be set to the same units. In this way, cost- and time-saving effects may be achieved using a removal tape with a reduced area.

In this case, the removal of the active material layer may be performed until the measurement limit is reached.

The measurement limit refers to a situation in which a portion of the active material layer is completely removed and a fixing material configured to fix the substrate and the active material layer is exposed to the outside.

For example, the measurement limit may refer to a case in which a deviation value of the adhesive strength with respect to a displacement for removal of the removal tape is significantly higher than a previous deviation value of the adhesive strength with respect to a displacement for removal of the removal tape when the removal tape is removed in a longitudinal direction. Specifically, the measurement limit may refer to a case in which the deviation value of the adhesive strength with respect to a displacement for removal of the removal tape is 5 or more times higher than the previous deviation value of the adhesive strength with respect to a displacement for removal of the removal tape, but the difference in the deviation values is not limited thereto. For example, a value of the measurement limit may vary depending on the adhesive strength between the substrate adhesive tape and the removal tape.

For example, as the removal of the active material layer is repeatedly performed, a portion of the active material layer is completely removed, and a moment in which the substrate adhesive tape is exposed appears. In this case, when the removal tape is again attached to the substrate adhesive tape, a portion of the substrate adhesive tape to and from which the removal tape is attached and removed may be measured to have a highly increased adhesive strength in comparison to the portion of the active material layer from which the removal tape was removed. Therefore, when there is a high deviation value of the adhesive strength with respect to a displacement for removal of the removal tape, this procedure may be determined to reach the measurement limit.

Further, after the adhesive strength is determined until the measurement limit is reached, an amount of the active material layer remaining on the substrate and the substrate adhesive tape may be in a range of 0.001 to 5%, based on the total amount of the active material layer.

In the method of measuring a distribution of a binder in an electrode according to the present invention, Step 5 includes determining a distribution of the binder according to the thickness of the electrode from the measured values obtained in Steps 3 and 4.

In Step 5, the distribution of the binder according to the thickness of the electrode may be determined from the adhesive strength measured while removing the removal tape and the thickness of the electrode measured after the removal.

For example, as shown in FIG. 1, the distribution of the binder may be determined through a distribution of the adhesive strength according to the thickness of the electrode in the graph (FIG. 1) using the electrode thickness and the adhesive strength as the X and Y axes, respectively. Also, the distribution of the binder may be determined through the distribution of the adhesive strength according to the thickness of the electrode on the basis of the distribution and standard deviation values of the adhesive strength determined from the data.

A method of manufacturing a secondary battery according to the present invention may include performing the method of measuring a distribution of a binder in an electrode on a plurality of electrodes manufactured under different conditions, and selecting electrodes having a uniform distribution of the binder according to thicknesses of the electrodes.

The method of measuring a distribution of a binder in an electrode may be performed on samples of the electrodes manufactured under various different conditions to determine a distribution of the binder in each of the electrodes. Among these, an electrode having the most uniform distribution of the binder according to a thickness of a removal tape may be selected to be used to manufacture a secondary battery including the electrode.

In this case, the plurality of electrodes manufactured under different conditions may refer to electrodes in which the active material layers have different thicknesses, the binders have different physical properties such as molecular weights, different types of the solvent are used to prepare the electrode slurries, and different types of active material or conductive material are used, and which have different densities. However, the electrodes manufactured under various different conditions are not limited thereto, and the electrodes may be electrodes manufactured by properly selecting conditions and modifying the selected conditions in a method of manufacturing electrodes having different distributions of a binder according to thicknesses of the electrodes.

For example, the conditions may be conditions in which the active material layers have different thicknesses. In particular, the thicknesses of the active material layers may be set to 35 μm and 80 μm to manufacture two electrodes having final electrode thicknesses of 55 μm and 100 μm and an electrode density of 3.4 g/cc. Then, the electrodes may be subjected to the method of measuring a distribution of a binder in an electrode to measure distributions of the binder in the two electrodes, and an electrode having a more uniform distribution may be used to manufacture a secondary battery.

In this case, the selection of the electrode may be performed through a distribution and standard deviation of measured values. Because an electrode in which a distribution and standard deviation of an adhesive strength are measured to be lower values has a more uniform distribution of the binder according to the thickness of the electrode, the electrode having the lower distribution and standard deviation values may be selected to be used.

The secondary battery according to the present invention may be manufactured according to the method of manufacturing a secondary battery. In this case, a standard deviation of an adhesive strength measured by the method of measuring a distribution of a binder in an electrode may be less than 50. When the standard deviation is greater than or equal to 50, there is a great difference in a magnitude of the adhesive strength according to a thickness of an electrode, and the difference indicates that the distribution of the binder according to a thickness of the electrode is not uniform. That is, this indicates that processability when the electrode is used to manufacture a secondary battery may be poor (detachment of an active material in a cutting process), and performances such as output, lifetime, and high-temperature storage characteristics of the manufactured secondary battery may be degraded.

The secondary battery may be manufactured by injecting an electrolyte into an electrode assembly manufactured by applying the selected electrode as either a positive electrode or a negative electrode and interposing a separator between the positive electrode and the negative electrode.

Conventional porous polymer films used as separators known in the art, for example, porous polymer films made of polyolefin-based polymers such as an ethylene homopolymer, a propylene homopolymer, an ethylene/butene copolymer, an ethylene/hexene copolymer, and an ethylene/methacrylate copolymer, may be used alone or in a stacked form as the separator in the electrode assembly. Also, conventional porous nonwoven fabrics, for example, nonwoven fabrics made of a glass fiber having a high melting point, a polyethylene terephthalate fiber, and the like may be used as the separator, but the present invention is not limited thereto.

The electrolyte may include a non-aqueous organic solvent and a metal salt.

Aprotic organic solvents such as N-methyl-2-pyrrolidinone, propylene carbonate, ethylene carbonate, butylene carbonate, dimethyl carbonate, diethyl carbonate, gamma-butyrolactone, 1,2-dimethoxyethane, tetrahydroxy Franc, 2-methyl tetrahydrofuran, dimethylsulfoxide, 1,3-dioxolane, formamide, dimethylformamide, dioxolane, acetonitrile, nitromethane, methyl formate, methyl acetate, phosphate triester, trimethoxymethane, a dioxolane derivative, sulfolane, methyl sulfolane, 1,3-dimethyl-2-imidazolidinone, a propylene carbonate derivative, a tetrahydrofuran derivative, ether, methyl propionate, ethyl propionate, and the like may, for example, be used as the non-aqueous organic solvent.

A lithium salt may be used as the metal salt. In this case, the lithium salt is a material which is easily dissolved in the non-aqueous electrolyte. For example, LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2 NLi$, chloroborane lithium, lower aliphatic lithium carbonate, lithium tetraphenylborate, imide, and the like may be used as the lithium salt.

According to another exemplary embodiment of the present invention, there are provided a battery module including a secondary battery as a unit cell and a battery pack including the same. The battery module and the battery pack may be used in mobile electronic devices, electric cars, hybrid electric cars, plug-in hybrid electric cars, or power storage devices because each of the battery module and the battery pack includes a secondary battery having excellent lifespan and output characteristics.

MODE FOR INVENTION

Hereinafter, preferred embodiments of the present invention will be described in detail so that a person having ordinary skill in the art to which the present invention belongs can easily put the present invention into practice. However, the present invention can be implemented in various different forms, and is not limited to the embodiments disclosed below.

Examples

Step 1: Manufacture of Positive Electrode Under Different Thickness Conditions

95% by weight of $Li(Ni_{0.6}Mn_{0.2}Co_{0.2})O_2$ as a positive electrode active material, 2% by weight of carbon black as a conductive material, and 3% by weight of PVDF as a binder were added to a solvent of N-methyl-2 pyrrolidone to prepare positive electrode slurry. Thereafter, an aluminum thin film of a positive electrode current collector having a thickness of 20 μm was coated with the positive electrode slurry, dried, and roll-pressed to manufacture a positive electrode which included an active material layer having a thickness of 35 μm and had a total electrode thickness of 55 μm and an electrode density of 3.4 g/cc.

Meanwhile, 95% by weight of $Li(Ni_{0.6}Mn_{0.2}Co_{0.2})O_2$ as a positive electrode active material, 2% by weight of carbon black as a conductive material, and 3% by weight of PVDF as a binder were added to the solvent of N-methyl-2 pyrrolidone to prepare positive electrode slurry. Thereafter, an aluminum thin film of a positive electrode current collector having a thickness of 20 μm was coated with the positive electrode slurry, dried, and roll-pressed to manufacture a positive electrode which included an active material layer having a thickness of 80 μm and had a total electrode thickness of 100 μm and an electrode density of 3.4 g/cc.

Hereinafter, the positive electrode having an electrode thickness of 55 μm was referred to as positive electrode A, and the positive electrode having an electrode thickness of 100 μm was referred to as positive electrode B.

Step 2: Measurement of Distribution of Binder in Electrode

Each of the positive electrode A and positive electrode B was processed to a size of 15 mm×50 mm (width×length).

An active material layer of the positive electrode A was fixed to a glass plate using a substrate adhesive tape so that the active material layer of the positive electrode A came into contact with the glass plate. Thereafter, a removal tape having a size of 20 mm×50 mm (width×length) was attached to a current collector of the positive electrode A to perform a 180° peeling test in which the removal tape was allowed to move to a distance of 50 mm from an original position thereof at a rate of 300 mm/min After the current collector was removed, an adhesive strength of the removal tape was measured, and a thickness of the electrode after the removal was measured. Then, a removal tape having a size of 10 mm×50 mm (width×length) was attached to the active material layer from which the current collector was removed to perform the peeling test. Subsequently, an adhesive strength of the removal tape was measured, and the thickness of the electrode after the removal of the removal tape was measured. Then, this procedure was repeated until the active material layer was removed. In this case, approximately 1.8% of a residue of the active material layer remained on the substrate from which the active material layer was removed.

Meanwhile, the removal tape having a size of 20 mm×50 mm (width×length) was attached to a current collector of the positive electrode B to perform the 180° peeling test in which the removal tape was allowed to move to a distance of 50 mm from an original position thereof at a rate of 300 mm/min After the current collector was removed, the adhesive strength of the removal tape was measured, and the thickness of the electrode after the removal was measured. Then, the removal tape having a size of 10 mm×50 mm (width×length) was attached to the active material layer from which the current collector was removed to perform the peeling test. Subsequently, the adhesive strength of the removal tape was measured, and the thickness of the electrode after the removal of the removal tape was measured. Then, this procedure was repeated until the active material layer was removed. In this case, approximately 2.0% of a residue of the active material layer remained on the substrate from which the active material layer was removed.

Values measured for the positive electrodes A and B are listed in Table 1. Among these, a graph plotted using the electrode thickness and the adhesive strength as the X and Y axes, respectively, is shown in FIG. 1.

Step 3: Selection of Electrodes Having Uniform Distribution of Binder According to Thickness

TABLE 1

| Positive electrode A | Electrode thickness (μm) | Adhesive strength (gf/15 mm) | Positive electrode B | Electrode thickness (μm) | Adhesive strength (gf/15 mm) |
|---|---|---|---|---|---|
| Start | 55 | | | 100 | |
| 1st cycle | 54 | 30.24 | 1st cycle | 99 | 7.39 |
| 2nd cycle | 49 | 261.43 | 2nd cycle | 93 | 193.38 |
| 3rd cycle | 42 | 223.84 | 3rd cycle | 88 | 166.90 |
| 4th cycle | 36 | 193.37 | 4th cycle | 80 | 110.00 |
| 5th cycle | 29 | 191.2 | 5th cycle | 73 | 129.92 |
| 6th cycle | 21 | 189.65 | 6th cycle | 67 | 119.89 |
| 7th cycle | 14 | 204.44 | 7th cycle | 60 | 132.10 |
| 8th cycle | 8 | 239.18 | 8th cycle | 53 | 134.46 |
| 9th cycle | 1 | 286.26 | 9th cycle | 47 | 153.62 |
| | | | 10th cycle | 39 | 158.75 |
| | | | 11th cycle | 33 | 187.50 |
| | | | 12th cycle | 26 | 211.07 |
| | | | 13th cycle | 20 | 235.86 |
| | | | 14th cycle | 13 | 279.44 |
| | | | 15th cycle | 8 | 318.8 |
| | | | 16th cycle | 2 | 437.5 |

As shown in FIG. 1, it can be seen that the positive electrode A had a distribution of adhesive strengths in a range of approximately 150 gf/15 mm to 260 gf/15 mm except for the adhesive strength measured at the last cycle (9th cycle), and the positive electrode B had a distribution of adhesive strengths in a range of approximately 110 gf/15 mm to 320 gf/15 mm except for the adhesive strength measured at the last cycle (16th cycle), and this indicates that the positive electrode B had a wider range of adhesive strengths, compared to the positive electrode A.

From the values listed in Table 1, it can be seen that the distribution and standard deviation values of the adhesive strength were 4,705 and 68.6, respectively, in the case of the positive electrode A, and 9,106 and 95, respectively, in the case of the positive electrode B, and this indicates that the distribution and standard deviation for the positive electrode B were 1.9 and 1.4 times higher, respectively, than the positive electrode A. Therefore, it can be seen that the positive electrode A had a more uniform distribution of the binder according to the thickness, compared to the positive electrode B.

Therefore, it can be seen that the electrode having a uniform distribution of the binder according to the thickness was positive electrode A.

Step 4: Manufacture of Secondary Battery

96% by weight of a carbon powder as a negative electrode active material, 3% by weight of polyvinylidene difluoride as a binder, and 1% by weight of carbon black as a conductive material were added to a solvent of N-methyl-2 pyrrolidone to prepare negative electrode slurry. Thereafter, a copper thin film of a negative electrode current collector having a thickness of 10 μm was coated with the negative electrode slurry and dried to manufacture a negative electrode, and the negative electrode was then roll-pressed. Subsequently, the positive electrode A of Step 1, the negative electrode, and a separator (porous polyethylene) were assembled using a stacking method to manufacture an electrode assembly. An electrolyte (ethylene carbonate (EC)/ ethyl methyl carbonate (EMC)=1/2 (volume ratio) and lithium hexafluorophosphate ($LiPF_6$; 1 mole) were injected into the electrode assembly to manufacture a secondary battery.

While the preferred embodiments of the present invention have been shown and described in detail, it should be understood by those skilled in the art that various changes in form and details may be made therein without departing from the scope of the invention as defined by the appended claims.

The invention claimed is:

1. A method of measuring a distribution of a binder in an electrode, comprising:
   measuring a thickness of an electrode in which an active material layer, which comprises an active material, a conductive material, and a binder, is formed on a current collector (Step 1);
   fixing the active material layer of the electrode to a substrate so that the active material layer comes into contact with the substrate (Step 2);
   attaching a removal tape to the current collector of the electrode, and then measuring an adhesive strength of the removal tape while removing the removal tape and the current collector and measuring a thickness of the electrode after the removal (Step 3);
   attaching a removal tape to the active material layer from which the current collector is removed, and then measuring an adhesive strength of the removal tape while removing portions of the removal tape and the active material layer and measuring the thickness of the electrode after the removal, wherein this procedure is repeated until a measurement limit is reached (Step 4); and
   determining a distribution of the binder according to the thickness of the electrode from measured values obtained in Steps 3 and 4 (Step 5).

2. The method of claim 1, wherein the active material, the conductive material, and the binder in Step 1 are $Li(Ni_{0.6}Mn_{0.2}Co_{0.2})O_2$, carbon black, and polyvinylidene fluoride (PVDF), respectively.

3. The method of claim 1, wherein the active material, the conductive material, and the binder in Step 1 are included at a weight ratio of 94 to 96:1 to 3:2 to 4.

4. The method of claim 1, wherein the adhesive strength of the removal tape in Step 3 is in a range of 500 gf/15 mm to 1,500 gf/15 mm.

5. The method of claim 1, wherein the removing of the removal tape and the current collector in Step 3 or the removing of the portions of the removal tape and the active material layer in Step 4 is performed using a peeling test.

6. The method of claim 1, wherein the measurement limit in Step 4 represents a limit at which a deviation value of the adhesive strength with respect to a displacement for removal of the removal tape is 5 or more times higher than a previous deviation value of the adhesive strength with respect to a displacement for removal of the removal tape.

7. A method of manufacturing a secondary battery, comprising:
 performing the method of measuring a distribution of a binder in an electrode as defined in claim 1 on a plurality of electrodes manufactured under different conditions; and
 selecting an electrode having a uniform distribution of a binder according to thicknesses of the electrodes.

8. The method of claim 7, wherein the plurality of electrodes manufactured under the different conditions comprise two electrodes having active material layers with different thicknesses.

9. The method of claim 8 wherein the active material layers of the electrodes have thicknesses of 55 μm and 100 μm, respectively, and the active material layers have an electrode density of 3.4 g/cc.

10. The method of claim 7, wherein the selecting of electrodes having a uniform distribution of a binder according to thicknesses of the electrodes is performed through distribution and standard deviation of measured values.

11. A secondary battery manufactured according to the method defined in claim 7,
 wherein a standard deviation of an adhesive strength measured by the method of measuring a distribution of a binder in an electrode is less than 50.

12. A battery module comprising the secondary battery of claim 11 as a unit cell.

13. A battery pack comprising the battery module of claim 12, wherein the battery pack is used as a power source for a device.

14. The battery pack of claim 13, wherein the device comprises a mobile electronic device, an electric car, a hybrid electric car, a plug-in hybrid electric car, or a power storage device.

* * * * *